United States Patent [19]

Otaka

[11] Patent Number: 5,418,475
[45] Date of Patent: May 23, 1995

[54] INPUT/OUTPUT CIRCUIT HAVING THE INPUT BUFFER CIRCUIT BEING CONNECTED IN PARALLEL WITH TWO TRANSISTORS WITH THE SAME POLARITY

[75] Inventor: Shoji Otaka, Yokohama, Japan

[73] Assignee: Kabushiki Kaisha Toshiba, Kanagawa, Japan

[21] Appl. No.: 208,111

[22] Filed: Mar. 9, 1994

[30] Foreign Application Priority Data

Mar. 10, 1993 [JP] Japan .................................. 5-049591

[51] Int. Cl.⁶ .............................................. H03K 17/16
[52] U.S. Cl. .......................................... 326/30; 326/33; 326/34
[58] Field of Search ................. 307/443, 448, 451, 475

[56] References Cited

U.S. PATENT DOCUMENTS

| | | | |
|---|---|---|---|
| 4,859,877 | 8/1989 | Cooperman et al. | 307/443 |
| 4,970,419 | 11/1990 | Hagen et al. | 307/443 X |
| 5,023,488 | 6/1991 | Gunning | 307/475 |
| 5,029,284 | 7/1991 | Feldbaumer et al. | 307/475 X |
| 5,084,637 | 1/1992 | Gregor | 307/475 |
| 5,107,230 | 4/1992 | King | 307/443 X |
| 5,208,492 | 5/1993 | Masumoto et al. | 307/443 X |
| 5,227,677 | 7/1993 | Furman | 307/443 |
| 5,341,039 | 8/1994 | Fukumoto | 307/443 |

FOREIGN PATENT DOCUMENTS 3-109626  5/1991  Japan.
4-207226  7/1992  Japan.

OTHER PUBLICATIONS

IBM *Technical Disclosure Bulletin*, vol. 32, No. 4A, Sep. 1989, pp. 393–395.
"A Study of 156 Mbps CMOS Driver-Receiver", Daijiro Inami, et al., Proceedings of the 1991 IEICE Spring Conference, C-634, pp. 5–225.

*Primary Examiner*—David R. Hudspeth
*Attorney, Agent, or Firm*—Finnegan, Henderson, Farabow, Garrett & Dunner

[57] ABSTRACT

An input terminal is connected commonly with a first transistor gate and drain and a second transistor source having the same polarity with the first transistor. A first transistor source is connected to a voltage source. A second transistor gate is connected to the voltage source through a variable voltage source. A second transistor drain terminal is used as a current output terminal, and an input terminal is used as a voltage output terminal. The input circuit is capable of obtaining a current gain approximating "1" while input impedance variation due to input signal variation maintain suppressed smaller.

23 Claims, 6 Drawing Sheets

INPUT/OUTPUT CIRCUIT HAVING THE INPUT BUFFER CIRCUIT BEING CONNECTED IN PARALLEL WITH TWO TRANSISTORS WITH THE SAME POLARITY

BACKGROUND OF THE INVENTION

1. Field of the Invention

The present invention relates to input/output circuits which are utilized in fields requiring high speed interfaces between LSI's. In particular, input/output circuits of the invention are used for ATM branch exchanges and various kinds of computers.

2. Description of the Related Art

In the fields of large-scale computers or telecommunication systems or the like, it is desirous to achieve high speed, high integration, and lower power consumption for LSI's forming the systems. At present, no process exists for satisfying all requirements of the high speed, high integration, and lower power consumption. Therefore in these fields, a process is selected from plurality of process corresponding to the desired function (the high speed, high integration, or lower power consumption).

A CMOS process designates a graded characteristic in view of lower power consumption and high integration in LSI. In a CMOS process, CMOS logic circuits in an IC operate at high speed. This comes from recent developments of refining techniques. However, a lower speed of signal transmission between LSI's is provided in usual CMOS interfaces because MOSFET has a smaller current driving ability compared to bipolar (here particularly, "ECL" [emitter coupled logic]) and CMOS interface is a transmission system without impedance matching. The operating speed of the system is limited in forming a large scale system since the operating speed of the interface reaches the limit. It is one method that input and output are developed in a parallel manner in order to increase the interface speed. However, in this case, wirings on a mounting board and so forth increase corresponding to such parallel development of the input and output, and consequently the, mount area on the board is larger.

An advantage of ECL processes includes realizing a high speed transmission since the driving ability of elements is higher in the ECL process, and an input/output interfaces having impedance matching in receiving ends are used in the ECL interface system. However, the ECL process provides smaller integration and, in general, higher power consumption compared to CMOS.

Both advantages of the ECL process and CMOS process are realized in one process using a BICMOS process, in which the input/output is formed of ECL, and a logic circuit using CMOS is provided. The BICMOS process achieves high speed, high integration, and lower power consumption. However, the BICMOS processes having more complicated production process requires higher costs than in the CMOS or bipolar process. In addition, a characteristic exceeding that of the single process can hardly be obtained with respect to high speeds high integration, and lower power consumption.

We have proposed a high speed input/output circuit using CMOS and capable of exhibiting lower power consumption and high integration characteristics together with considerations of impedance matching, which is described in Japanese Patent Application HEI-2-325204 in 1990. FIG. 7 is a circuit diagram of the input/output circuit, where MOSFET circuits having double complimentary polarity used. Throughout this specification, MN represents NMOS FET, and MP represents PMOS FET.

In FIG. 7, numeral 101 depicts an output buffer circuit, 102 an input buffer circuit, 103 a transmission line connecting across the output buffer circuit 101 and the input buffer circuit 102.

In the output buffer circuit 101, $I_{i1}$ depicts a current source for supplying current corresponding to a logic value H, and $I_{i2}$ a current source for supplying current corresponding to a logic value L. Either of the current sources $I_{i1}$ or $I_{i2}$ is connected to a terminal 110 by turning a switch SW. The terminal 110 is connected to the transmission line 103.

In the input buffer circuit 102, 111 depicts an input terminal, which is connected to the transmission line 103. A source terminal of $MN_{111}$ and a source terminal of $MP_{111}$ are connected to the input terminal 111. A gate terminal of $MN_{111}$ is connected to cathode-side of a voltage source $V_{110}$ and the anode-side of a voltage source $V_{111}$. The anode-side of the voltage source $V_{110}$ is connected to a positive power supply $V_{DD}$ (terminal 10), a drain terminal of $MN_{111}$ is connected to the positive power supply $V_{DD}$ (terminal 10), a gate terminal of $MP_{111}$ is connected to cathode-side of the voltage source $V_{111}$, and a drain terminal of $MP_{111}$ is connected to a terminal 114, which is an output terminal of the input buffer circuit 102. The output terminal 114 is connected, for example, to the logic circuit through a current mirror circuit, which is omitted in the drawing.

Assuming that a signal input into the input buffer circuit 102 from the output buffer circuit 101 is of current form, and the current source $I_{i1}$ is connected to the terminal 110 by the switch SW, where a current $I_H$ of the current source $I_{i1}$ is input into the input buffer circuit 102 through the transmission line. A part of the current $I_H$ is absorbed in $MN_{111}$ at the input buffer circuit 102. A current $I_{B1}-I_H$ being a difference between the bias current $I_{B1}$ and the current $I_H$ of current source $I_{i1}$ flows into $MP_{111}$. The bias current $I_{B1}$ is decided by $MP_{111}$, $MN_{111}$ and $V_{111}$. Thus, a part of the signal $I_H$ is transmitted to the terminal 114. When the current source $I_{i2}$ is connected to the terminal 110 by the switch SW, a reverse operation thereto is provided.

An input impedance of this circuit is equal to a paralleled impedance of $MN_{111}$ and $MP_{111}$, which is approximately shown by the following equation.

$$Zin = 1/(gm, MN_{111} + gm, MP_{111})$$

where $gm, MN_{111}$ represents transconductance of $MN_{111}$, and $gm, MP_{111}$ represents transconductance of $MP_{111}$.

$MN_{111}$ and $MP_{111}$ are complementarily operated each other in the input buffer circuit 102 since gm is directly proportional to a square root of the operating current in the MOSFET. Thus, the current source dependency of the input impedance is smaller.

However in the input buffer circuit 102, some of the input current flows into the positive power supply $V_{DD}$ (terminal 10) through $MN_{111}$ so that the input buffer circuit has a current gain of about ½ from the input terminal 111 to the output terminal 114, that is, a drawback of the input buffer circuit 102 includes a current gain of about ½ compared to the conventional example, in spite of easily obtaining impedance matching.

SUMMARY OF THE INVENTION

The present invention has been made for solving the problems described above.

An object of the present invention is to provide an input/output circuit capable of achieving a high speed, high integration and lower power consumption.

Another object of the invention is to provide an input/output circuit capable of setting an input terminal voltage to a desirous potential and suppressing into a small value an input impedance variation due to change of input signals, and more specifically to provide a input/output circuit capable of accurately setting an impedance of the input terminal while maintaining a lower voltage of the circuit.

Further another object of the invention is to provide an input/output circuit capable of upgrading a current gain, and more specifically to provide an input/output circuit capable of permitting the current gain approximating "1".

Still another object of the invention is to provide an input/output circuit in which a potential of the input terminal is prevented from shifting from the set value even in process fluctuation or temperature change.

To achieve the object described above, an input/output circuit of the invention connected to an output buffer circuit through a transmission line, the input buffer circuit comprises; an input terminal that is a voltage output terminal of the input/output circuit, the input terminal being connected to the transmission line; a first transistor having a drain terminal and a gate terminal connected to the input terminal; a second transistor having a source terminal connected to the input terminal, the second transistor having the same polarity with the first transistor; and a current output terminal is to a drain terminal of the second transistor.

In the input/output circuit of the invention, a current value to the transistor and the size of transistor are made a predetermined value and size respectively to set an input terminal voltage to a desirous potential and to set desired input impedance of the circuit.

Furthermore in the input/output circuit of the invention, the drain terminal of $MP_1$ and the source of $MP_2$ are connected to the input terminal 2, and yet the gate terminal of $MP_1$ is also connected to the input terminal 2, this prevents the relatively larger current from flowing to the opposite-side to the output terminal, therefore the current gain can be upgraded compared to the conventional circuit, more specifically, approximating "1".

The present invention will more clearly be understood by one skilled in the art in accordance with the embodiments as hereinafter shown and described in this specification.

DESCRIPTION OF THE PREFERRED EMBODIMENTS

Figure 1:
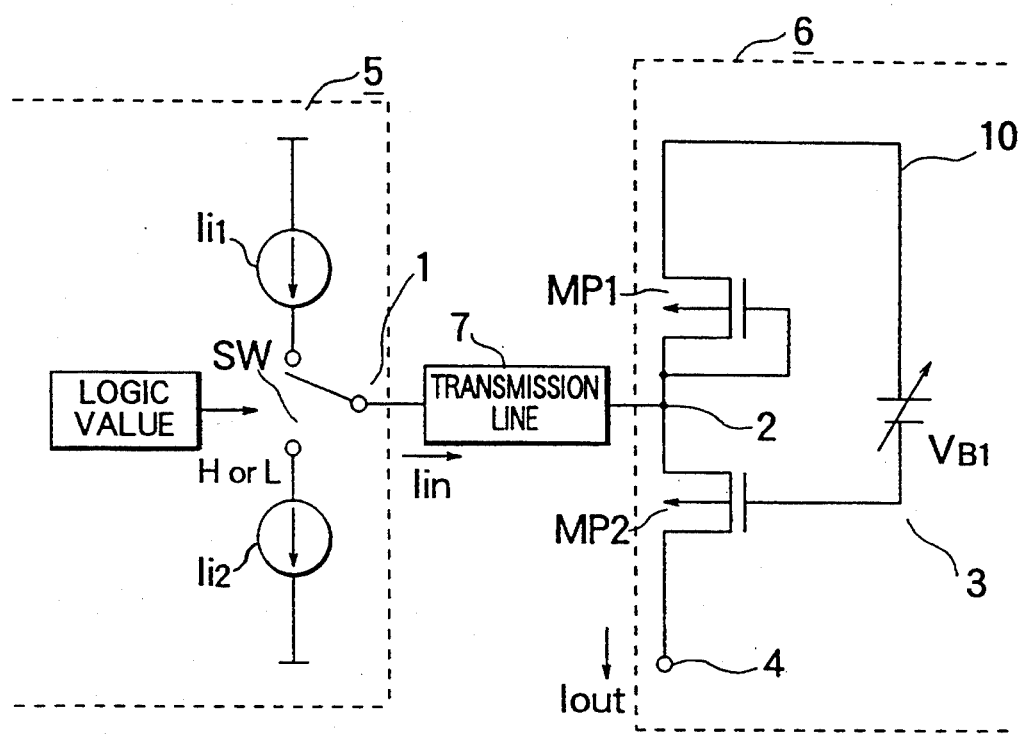
FIG. 1 is a circuit diagram including an input buffer circuit according to a first embodiment of the present invention.

The embodiments according to the invention will be described referring to the drawings.

Input/output circuits of the embodiments as hereinafter shown and described use MOSFET's each having single polarity, where MN depicts NMOS FET, and MP depicts PMOS FET.

A first embodiment will be described with reference to FIG. 1.

In FIG. 1, numeral 5 depicts an output buffer circuit, 6 an input buffer circuit, and 7 a transmission line connecting the output buffer circuit 5 and the input buffer circuit 6.

In the output buffer circuit 5, $I_{i1}$ depicts a current source supplying a current corresponding to a logic value H, and $I_{i2}$ depicts a current source supplying a current corresponding to a logic value L, either of the current source $I_{i1}$ or $I_{i2}$ is connected to the terminal 1 by switching a switch SW, and a terminal 1 is connected to the transmission line 7.

In the input buffer circuit 6, numeral 2 depicts an input terminal, which is connected to the transmission line 7. A drain terminal of $MP_1$, a gate terminal of $MP_1$, and a source terminal of $MP_2$ are connected to the input terminal 2. A source terminal of $MP_1$ is connected to a positive power supply $V_{DD}$ (terminal 10), to which the anode-side of a voltage source $V_{B1}$ is connected. A gate terminal of $MP_2$ is connected to the cathode-side of the voltage source $V_{B1}$ and a drain-side of $MP_2$ is connected to an output terminal 4 that is the output terminal for outputting current. The input terminal 2 is simultaneously used as the output terminal for outputting voltage. The output terminal 4 is connected, for example, to a logic circuit through a current mirror circuit although omitted in the drawing.

In the output buffer circuit 5, with the logic value H used, the current source $I_{i1}$ is connected to the terminal 1 by a switch SW, then a current $I_H$ of the current source $I_{i1}$ is input into the input buffer circuit 6 through the transmission line 7. In the input buffer circuit 6, the current $I_H$ input from the input terminal 2 flows into the output terminal 4 through $MP_2$, at this time the current flowing into $MP_2$ increases to raise a potential of the input terminal 2. On the other hand, current flowing into $MP_1$ decreases compared to the case of an input current "0" input from the input terminal 2. This is because a potential of the input terminal 2 increases. A current difference between a current flowing into $MP_2$ and a current flowing into $MP_1$ becomes equal to $I_H$ being approximately a current of $I_{i1}$.

In the output buffer circuit 5, with the logic value L used, the current source $I_{i2}$ is connected to the terminal 1 by the switch SW, then a current $I_L$ of the current source $I_{i2}$ is input into the input buffer circuit 6 through the transmission line 7. In the output buffer circuit 6, a current $I_L$ input from the input terminal 2 flows into the positive power supply $V_{DD}$ through $MP_1$, thus the current flowing through $MP_1$ increases, a potential of the input terminal 2 is lowered, and a current flowing into MP$_2$ is decreased with lowering of the potential of the terminal 2. A current difference between a current flowing into MP$_2$ and a current flowing into MP$_1$ becomes approximately equal to the current I$_L$ of I$_{l2}$.

Therefore in the input buffer circuit 6, the current output from the output terminal 4 can be taken as a current output, and the voltage output from the input terminal 2 can be taken as a voltage output. The current output from the input terminal can be taken as a current output by using a current mirror circuit.

Assuming that a bias current I$_{BIAS}$ determined by the MP$_1$, the MP$_2$ and the variable voltage source V$_{B1}$ flow into the output terminal 4, then the bias current I$_{BIAS}$ is adjusted by varying the size of transistors MP$_1$ and MP$_2$ and the voltage of variable voltage source V$_{B1}$. An input impedance Zin of the input buffer circuit 6 is expressed by the following equation approximately, $$Zin = 1/(gm,MP_1 + gm,MP_2)$$

where gm,MP$_1$ represents a transconductance of MP$_1$, and gm,MP$_2$ represents a transconductance of MP$_2$.

A potential of the input terminal 2 is substantially determined by the following equation, $$Vin = (I_{BIAS}/\beta, MP_1)^{\frac{1}{2}} + V_{T,P}$$

where $\beta$,MP$_1$ represents constant determined by process and a size of MP$_1$, and V$_{T,p}$ represents a threshold voltage of MP$_1$.

In accordance with the two equations listed above, the voltage of voltage source V$_{B1}$ and the size of MP$_1$ and MP$_2$ are adjusted, and input-terminal potential and input impedance can optionally be set. For example, the positive power supply 10 can be set to GND, a potential of the input terminal 2 can be matched to an input level of ECL, and in addition, an input impedance thereof can be set to 50 [$\Omega$]. In addition, the circuit of FIG. 1 can achieve lower voltage since the circuit is comprised of bunk lengthwith transistors. In the input/output circuit of the invention, the impedance of input terminal 2 can be precisely set while intending lower voltage for the circuit. The lowered voltage realized provides smaller power consumption, and the higher accurate impedance provided reduces reflection of signals to be input into the input terminal 2.

Figure 7:
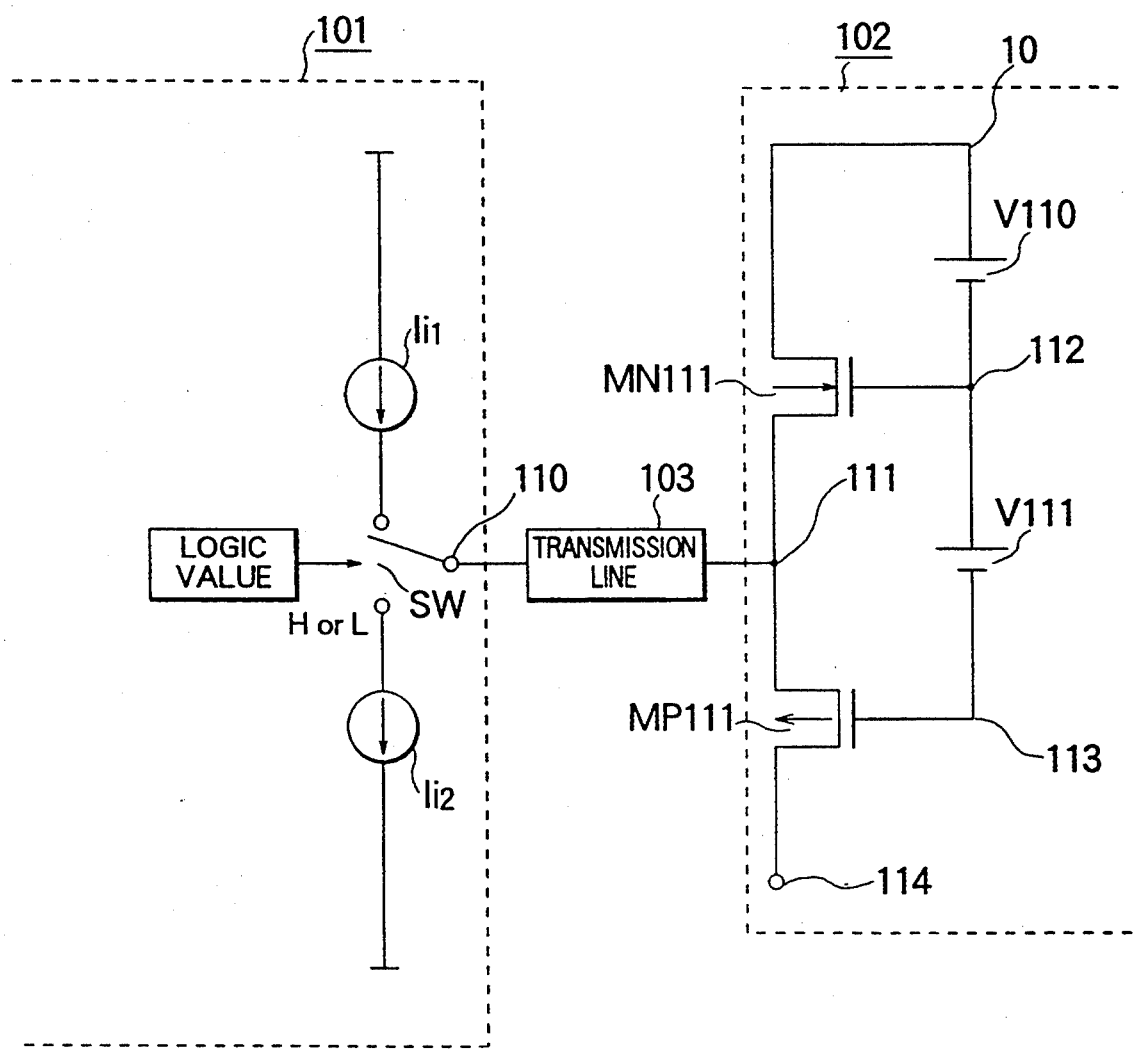
FIG. 7 is a circuit diagram including the conventional input buffer circuit.

In the conventional input/output circuit shown in FIG. 7, the source terminal of MN$_{111}$ and the source terminal of MP$_{11}$ are connected to the input terminal 111, where the input impedance is a parallel impedance of MN$_{111}$ and MP$_{111}$, thus a part of input current flows to the positive power supply V$_{DD}$ through MN$_{111}$, the current gain from the input terminal 111 to the output terminal 114 results in about $\frac{1}{2}$. In the input/output circuit according to the invention, the drain terminal of MP$_1$ and the source of MP$_2$ are commonly connected to the input terminal 2, and yet the gate terminal of MP$_1$ is also connected to the input terminal 2, avoiding simple parallel connection of MP$_1$ and MP$_2$, and preventing the relatively larger current from flowing to the opposite-side to the output terminal of input/output circuit. Therefore the current gain can be upgraded to approximating "1" compared to the conventional circuit since the current change quantity can be gotten from MP$_1$ and MP$_2$ by comprising a current mirror circuit which detects current flowing MP$_1$.

Figure 2:
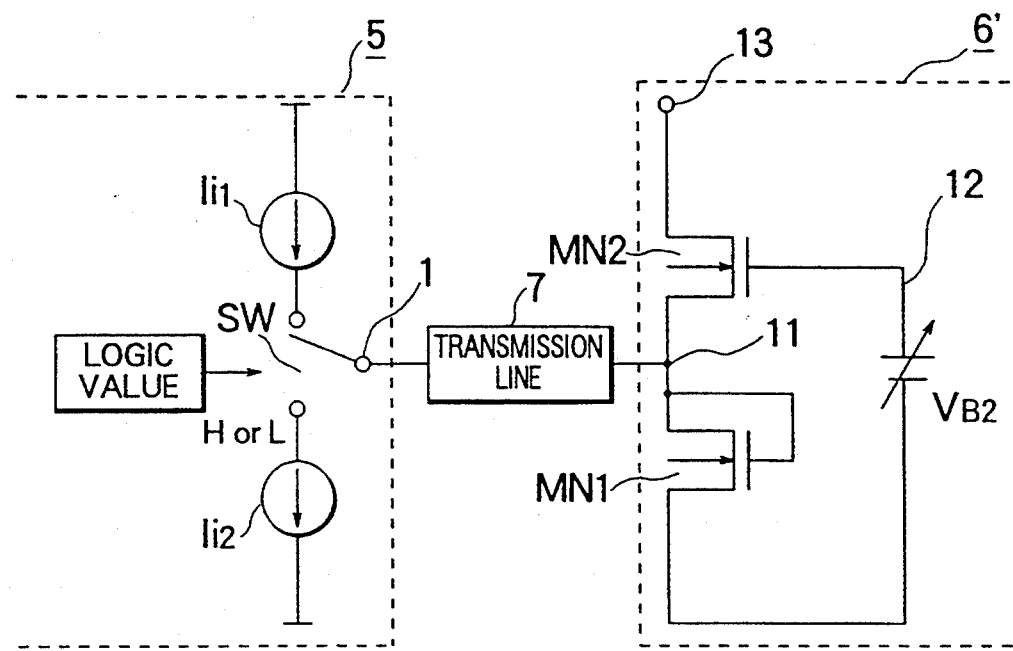
FIG. 2 is a circuit diagram including an input buffer circuit according to a second embodiment of the present invention.

A second embodiment is shown in FIG. 2. An input buffer circuit 6' shown in the drawing is of substantially the same structure as in the input buffer circuit 6 in FIG. 1, where MP$_1$ and MP$_2$ are replaced by MN$_1$ and MN$_2$ respectively. The similar operations are also provided for the circuit, therefore the explanation thereof will be omitted throughout. The input buffer circuit 6' exhibits the same effect as in the input buffer circuit 6 in FIG. 1. In particular, the input buffer circuit 6' of the embodiment provides high speed processing because of its circuit structure using only NMOS having a graded frequency-characteristics.

The embodiments have been described assuming that the input signals are in current form. However, the input signals can be explained equivalently as a current signal in case where input signals such as interface with ECL is of a voltage form. A voltage V input into the input buffer circuit 6 (6') is converted into a current V/R in the transmission line 7 by a characteristic impedance R of the transmission line 7. Generally, to prevent reflection the characteristic impedance of transmission line 7 is made equal to an terminal impedance thereof. According to the invention, the input impedance of the input buffer circuit 6 (6') stands for the terminal impedance. With these impedances being equal to each other, the current V/R is not reflected at the input terminal 2 and is transmitted to the input terminal 2. In balancing condition, the current V/R can flow constantly by the input voltage V and the impedance R of the input buffer circuit 6 (6'), thus the input signals can equivalently be explained by the current input even when the input signals are of voltage forms.

Figure 3:
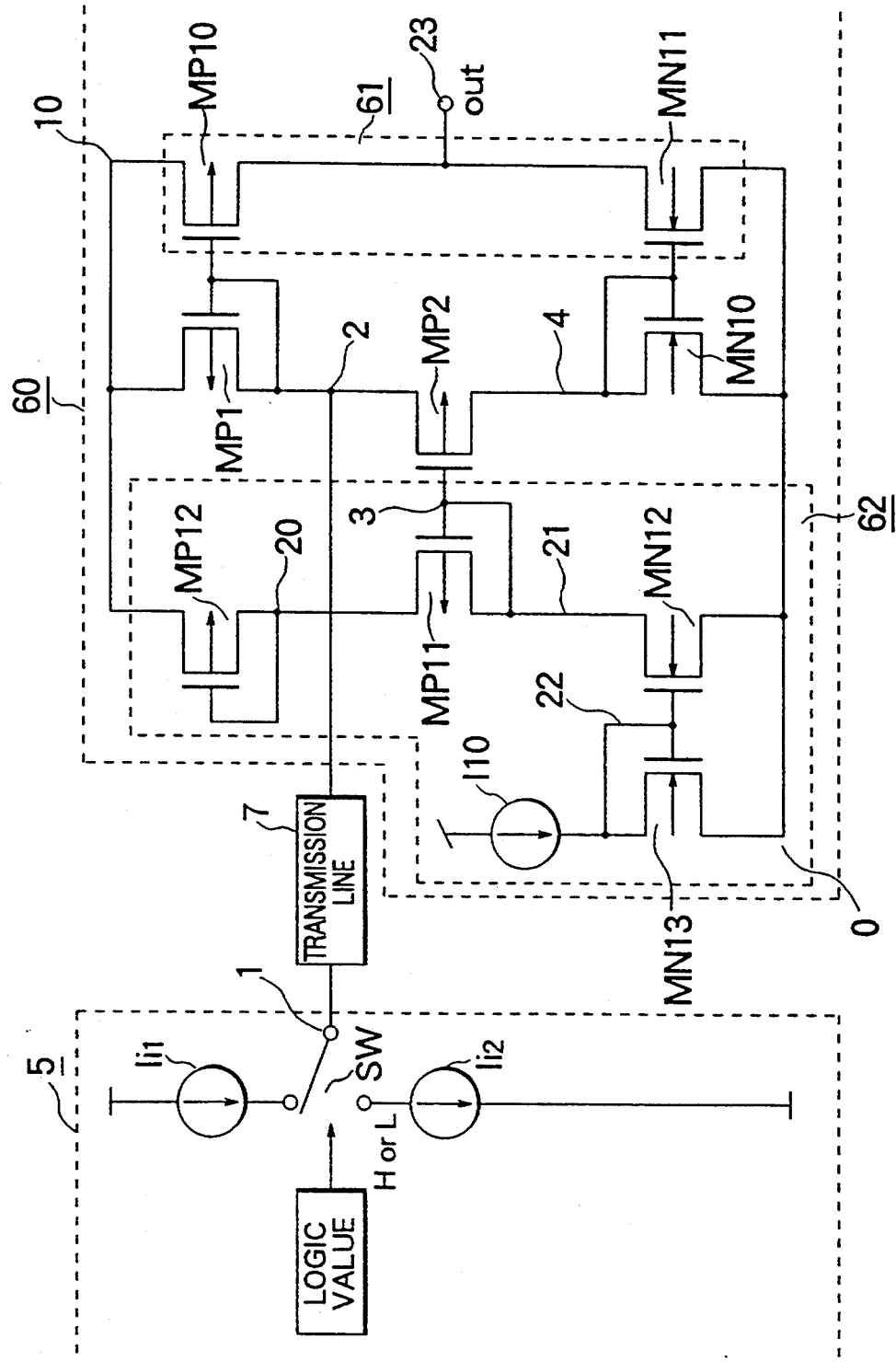
FIG. 3 is a circuit diagram including an input buffer circuit according to a third embodiment of the present invention.

A third embodiment is described in accordance with FIG. 3.

The input buffer circuit 6 in FIG. 1 is added with a current output buffer circuit 61 and a bias current circuit 62 to produce an input buffer circuit 60 as shown in the drawing.

In the current output buffer circuit 61, a current mirror circuit is formed between a MP$_{10}$ and the MP$_1$. A current flowing through MP$_2$ is conducted into a MN$_{10}$, a current mirror circuit forms between the MN$_{10}$ and a MN$_{11}$, and terminal 23 is the output of the ciucuit.

MP$_{11}$, MP$_{12}$ in a bias circuit 62 and MP$_2$, MP$_1$ form a current mirror circuit. A current from a current source I$_{10}$ is supplied to MP$_{11}$ through a current mirror circuit formed between the MN$_{12}$ and a MN$_{13}$.

As in the embodiment in FIG. 1, in the output buffer circuit 5, with the logic value H used, the current source I$_{l1}$ is connected to the terminal 1 by the switch SW, then the current I$_H$ of the current source I$_{l1}$ is input into the input buffer circuit 6 (60) through the transmission line 7. In the input buffer circuit 6, the current I$_H$ input from the input terminal 2 flows into the output terminal 4 through MP$_2$. A current flowing the terminal 4 of MN$_{10}$ is approximately larger by I$_H$ from current source I$_{l1}$ than the current flowing into MP$_1$. MN$_{10}$ and MN$_{11}$ form the current mirror circuit on the assumption that the ratio of current is 1:1, thus MN$_{11}$ intends the same current flow as that flowing into MN$_{10}$. MP$_1$ and MP$_{10}$ also form a current mirror circuit, thus MP$_{10}$ intends the same current flow as that flowing into MP$_1$. Therefore, when the output terminal 23 has a high impedance such as a conventional CMOS logic, a balancing condition is provided at a point where the current of MP$_{10}$ is the same as that of MN$_{11}$, the output terminal 23 comes to L. With the logic value L used, the current source I$_{l2}$ is connected to the terminal 1 by the switch SW, then the current L of current source I$_{l2}$ is input into the input buffer circuit 6 (60) through the transmission line 7. This case is produced by a reverse operation to the former explanation, the output terminal 23 comes to H.

In the input buffer circuit 60, the output terminal 23 can be taken as a voltage output, and of course, a voltage output from the input terminal 2 can be taken out as a voltage output.

The foregoing is for the input in current form, however, the same operation is provided for the input in voltage form.

Figure 4:
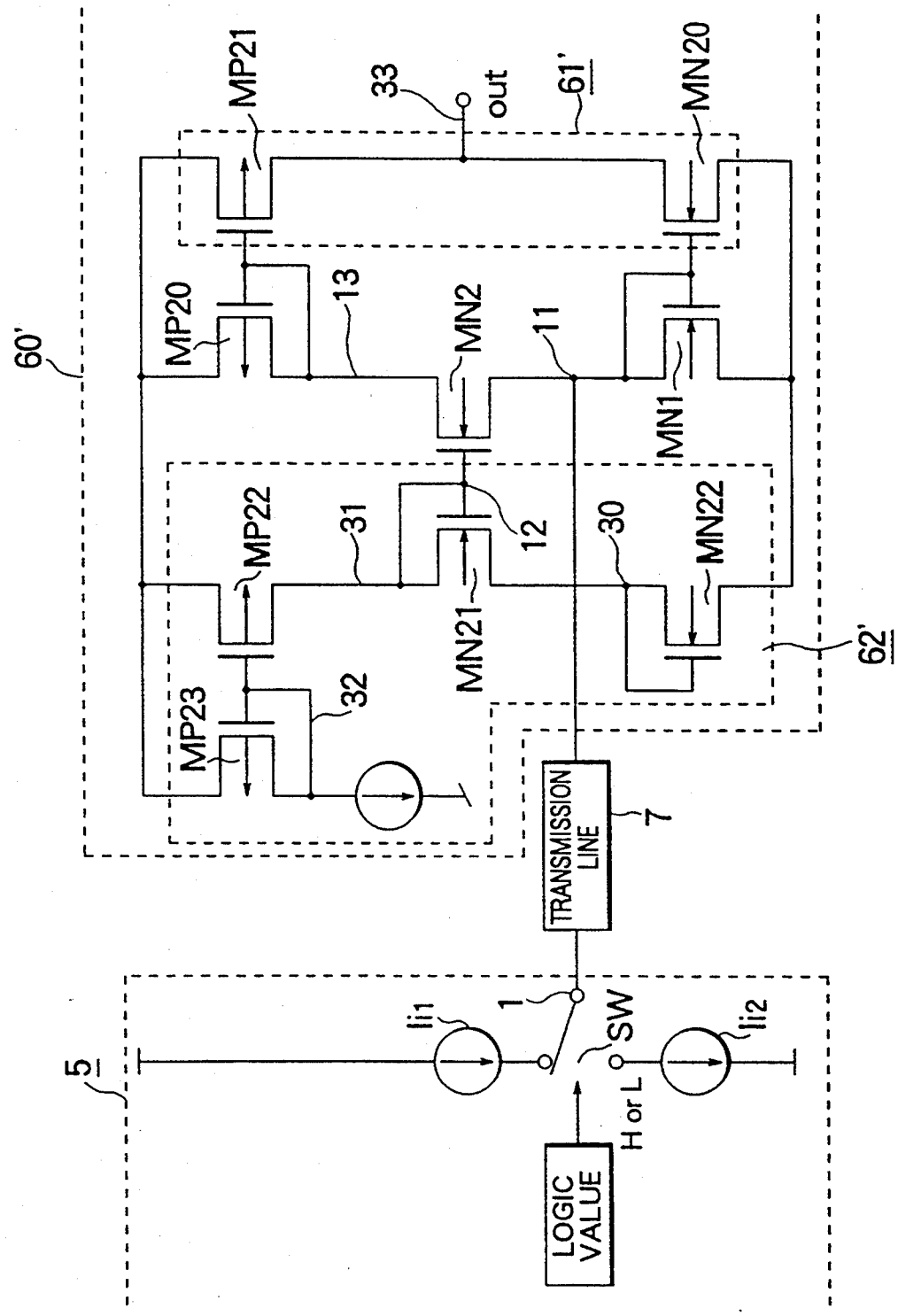
FIG. 4 is a circuit diagram including an input buffer circuit according to a fourth embodiment of the present invention.

A fourth embodiment is described in FIG. 4. An input buffer circuit 60' is provided in the drawing using reversed polarities of the transistors and the voltage source of the input buffer circuit 60 in FIG. 3, therefore circuit construction and circuit operation will be omitted.

The input/output circuit as described above still has fluctuation in processes, such as shifting in setting values of the potential of the input terminal. To prevent these, an embodiment using a bias current source including a feedback circuit is proposed and described as follows.

Figure 5:
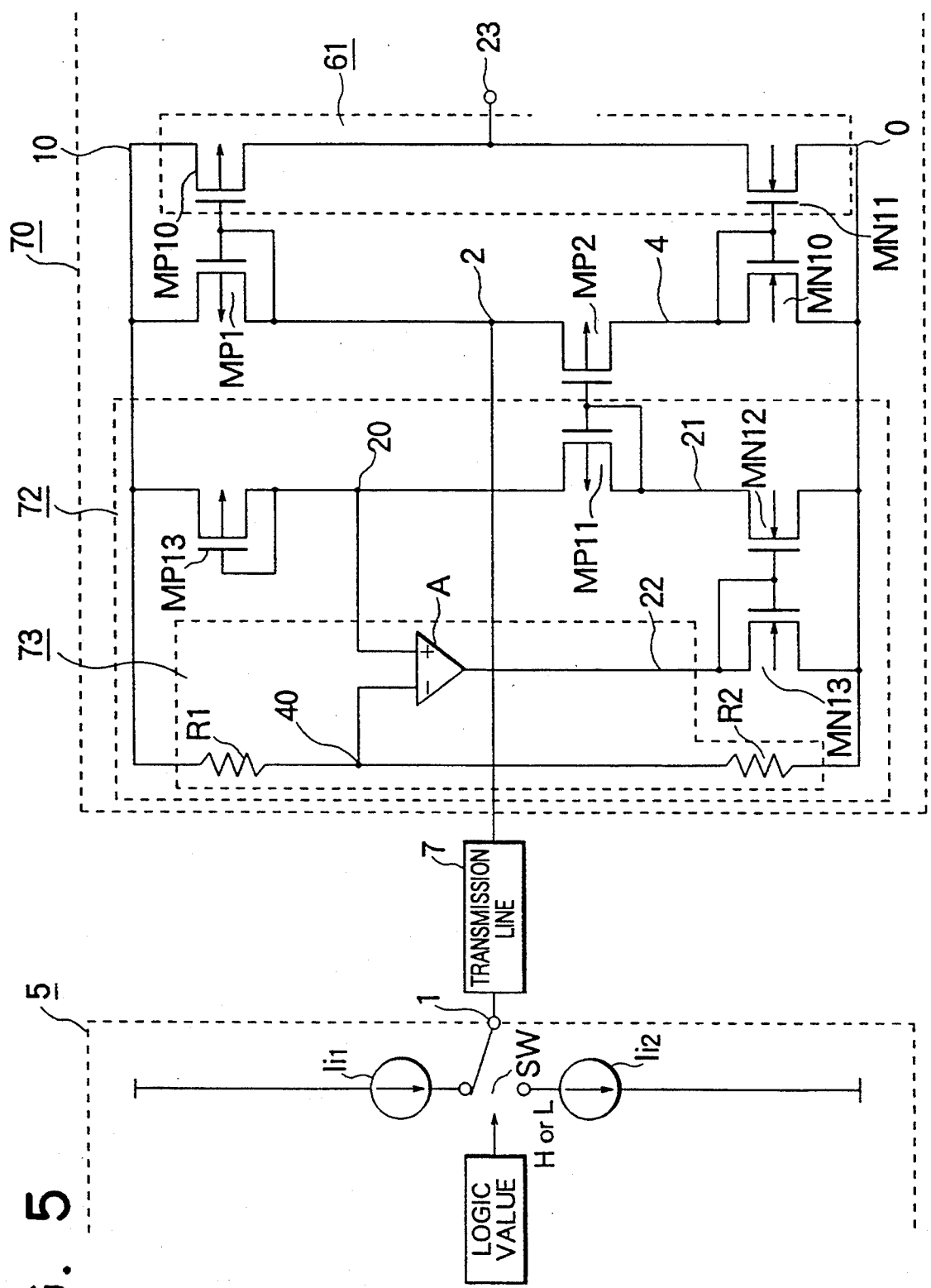
FIG. 5 is a circuit diagram including an input buffer circuit according to a fifth embodiment of the present invention.

FIG. 5 shows the embodiment, where the bias current circuit 62 of input buffer circuit 60 in FIG. 3 is added with a feedback circuit 73 to produce a current circuit 72 of an input buffer circuit 70 in the drawing. In the feedback circuit 73, a (+) input terminal of a voltage to current converter amplifier A is connected to a terminal 20, a (−) input terminal of the voltage current converter amplifier A is connected to a terminal 40, and an output terminal of the voltage current converter amplifier A is connected to a terminal 22. The voltage current converter amplifier A corresponds to the current source I10 in FIG. 3. The terminal 40 is connected to each one-end of resistances R1 and R2, the other-side terminals of the resistances R1 and R2 are connected to the voltage source $V_{DD}$ (terminal 10) and a voltage source $V_{SS}$ (terminal 0) respectively. A potential of the terminal 40 is determined by a ratio of the resistances value of $R_1$ to that of $R_2$. A potential of the terminal 20 corresponds to a potential of the input terminal 2. Therefore, the potential of input terminal 2 is set at the potential of the terminal 40 which is decided by a ratio of $R_1$ and $R_2$, and the action of the voltage current converter amplifier A.

In IC, the resistance ratio can relatively easily be controlled although the absolute value of resistance is hardly controlled. Since temperature coefficients of these resistances are determined by types of materials, the temperature coefficients are equal each other. With the layout formed in adjacent manner, the respective resistance temperatures become substantially equal to each other. For this reason, the potential of terminal 40 can easily be fit to design value, and yet the temperature variation is negligibly small, where those potentials are given as a reference potential to (−) input terminal of the amplifier. A potential of the terminal 20 is occasionally shifted from the design value because of process fluctuation or temperature variation, which is described referring to an example when shifting to a higher potential-side as follow. A potential of the terminal 20 is higher than that of the terminal 40, this causes the amplifier A to provide a larger current to a $MN_{13}$. The $MN_{13}$ and $MN_{12}$ constitutes a current mirror circuit to produce and transmit a current increase to $MP_{13}$. Thus, the potential of terminal 20 (that is, the potential of input terminal 2) falls down to the same potential as the potential of terminal 40. In this case, the input impedance is varied with change of an operating current of input/output circuit, but such variation is as low as an extent of several [β], and without largely affecting.

Figure 6:
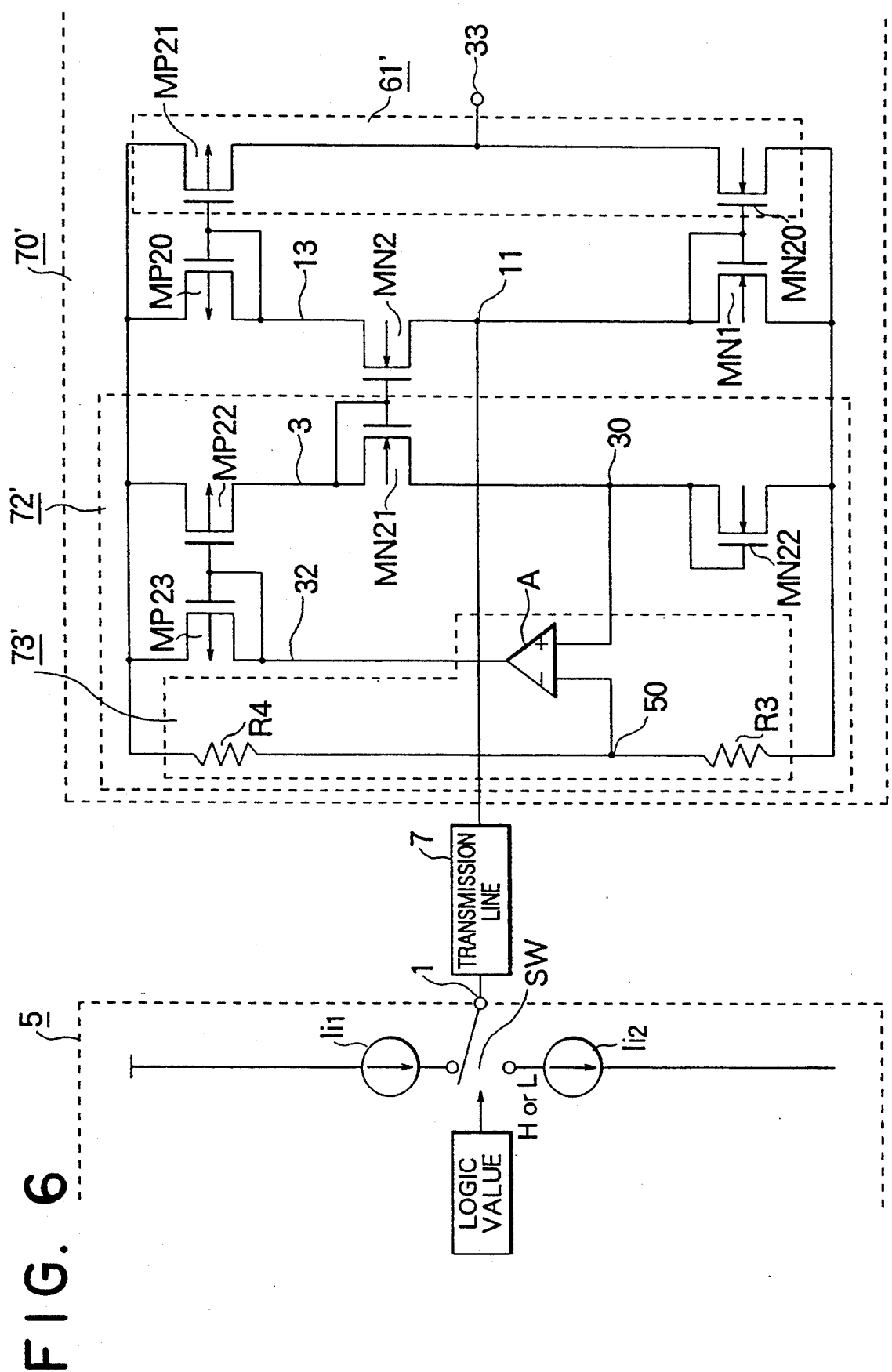
FIG. 6 is a circuit diagram including an input buffer circuit according to a sixth embodiment of the present invention.

FIG. 6 shows a sixth embodiment. An input buffer circuit 70' is provided in the drawing using reverse polarities of the transistors and the voltage source of the input buffer circuit 70 in FIG. 5, therefore the explanation for circuit construction and circuit operation will be omitted.

The embodiments above have been described only for CMOS. However, it is understood that the present invention can be realized by processes using bipolarity transistors such as silicon bipolar transistors.

As hereinbefore fully described, according to the invention, a parallel circuit having two of the same polarity transistors is provided on a terminal end in an input stage of an input/output circuit for transmitting between LSI's. Two outputs, current output, and voltage output are provided in the input circuit, and there can therefore be formed a circuit having a current gain approximating "1" while input impedance variation due to input signal change is suppressed to a smaller value.

What is claimed is:

1. An input/output circuit for inputting signals through a transmission line, the input/output circuit comprising:

an output buffer circuit for outputting signals into the transmission line; and an input buffer circuit for inputting signals from the transmission line;

the input buffer circuit having:

an input terminal that is a voltage output terminal of the input buffer circuit, the input terminal being connected to the transmission line;

a first transistor having a drain termianl and a gate termianl connected to the input terminal;

a second transistor having a source terminal connected to the input terminal, the second transistir having the same channel conductivity type polarity with the first transistor; and a current output termianl connected to a drain termianl of the second transistor.

2. An input buffer circuit connected to an output buffer circuit through a transmission line, the input buffer circuit comprising:

an input terminal that is a voltage output terminal of the input buffer circuit, the input terminal being connected to the transmission line;

a first transistor having a drain terminal and a gate terminal connected to the input terminal;

a second transistor having a source terminal connected to the input terminal, the second transistor having the same channel conductivity type polarity with the first transistor; and a current output terminal connected to a drain terminal of the second transistor.

3. An input buffer circuit as claimed in claim 2, the input buffer circuit further comprising; a bias voltage source included between the source terminal of the first transistor and the gate terminal of the second transistor.

4. An input buffer circuit as claimed in claim 3, wherein the bias voltage source comprise:

a first current supply circuit for supplying a current responsive to a current flowing into the second transistor to the source terminal of the first transistor, and a second current supply circuit for supplying a current to the first current supply circuit.

5. An input buffer circuit as claimed in claim 3, wherein the bias current source comprises:
a first current supply circuit for supplying a current responsive to a current responsive to a current flowing into the second transistor to the source terminal of the first transistor;
a potential setting means for setting the input terminal potential to a predetermined value; and
a second current supply circuit for supplying a current to the first current supply circuit depending on a difference between a potential set by the potential setting means and a potential corresponding to a potential of input terminal.

6. An input buffer circuit as claimed in claim 5, wherein a voltage difference between a first voltage source connected to the source terminal of the first transistor and a second voltage source connected to the drain terminal of the second transistor is voltage-divided to set a set potential by the potential setting means.

7. An input buffer circuit as claimed in claim 6, wherein the first voltage source connected to the source terminal of the first transistor and the second voltage source connected to the drain terminal of the second transistor are connected to each other through a first resistance having a predetermined value and a second resistance having a predetermined value which are connected in series with each other, and a set potential by the potential setting means is obtained from a connecting point of the first resistance and the second resistance.

8. An input buffer circuit as claimed in claim 5, wherein the second current supply circuit extracts the input terminal potential from the first current supply circuit.

9. An input buffer circuit as claimed in claim 2, wherein the first and second transistors are formed of NMOSFETs.

10. An input buffer circuit as claimed in claim 2, wherein the first and second transistors are formed of PMOSFETs.

11. An input buffer circuit as claimed in claim 2, wherein said input signals are logical values corresponding to binary digital signals.

12. An input buffer circuit as claimed in claim 2, wherein said first transistor and said second transistor are composed so that a size of said first transistor may be about equal to a size of said second transistor.

13. An input buffer circuit as claimed in claim 2, wherein said transmission line is a connection line between IC's, and said transmission line has a designated specific impedance.

14. An input buffer circuit as claimed in claim 2, wherein said input buffer circuit obtains impedance matching for said transmission line by causing bias current to flow between said first transistor and said second transistor.

15. An input buffer circuit connected to an output buffer circuit through a transmission line, the input buffer circuit comprising:

an input terminal that is a voltage output terminal of the input buffer circuit, the input terminal connected to the transmission line;
a first transistor having a drain terminal and a gate terminal connected to the input terminal;
a second transistor having a source terminal connected to the input terminal, the second transistor having the same channel conductivity type polarity with the first transistor;
a first current circuit for supplying a current depending on a current flowing into the first transistor;
a second current circuit for supplying a current depending on a current flowing into the second transistor; and
a current output terminal for outputting a current flowing into the first and second current circuits.

16. An input buffer circuit as claimed in claim 15, the input buffer circuit further comprising; a bias current source included between the source terminal of the first transistor and the gate terminal of the second transistor.

17. An input buffer circuit as claimed in claim 16, wherein the bias current source comprise:
a first current supply circuit for supplying a current depending on a current flowing into the second transistor to the source terminal of the first transistor; and
a second current supplying circuit for supplying a current to the first current supply circuit.

18. An input buffer circuit as claimed in claim 16, wherein the bias current source comprises:
a first current supply circuit for supplying a current depending on a current flowing into the second transistor to the source terminal of the first transistor;
a potential setting means for setting a potential of the input terminal to a predetermined value; and
a second current supply circuit for supplying to the first current supply circuit a current depending on a difference between a potential set by the potential setting means and a potential of the input terminal.

19. An input buffer circuit as claimed in claim 18, wherein a voltage difference between a potential at the source terminal-side of the first transistor and a potential at the drain terminal-side of the second transistor is voltage-divided to set a potential by the potential setting means.

20. An input buffer circuit as claimed in claim 19, wherein a potential at the first transistor source terminal-side and the second transistor drain terminal-side are connected each other through a first resistance having a predetermined value and a second resistance having a predetermined value which are connected in series with each other, and a set potential by the potential setting means is obtained from a connecting point of the first resistance and the second resistance.

21. An input buffer circuit as claimed in claim 18, wherein the second current supply circuit extracts the input terminal potential from the first current supply circuit.

22. An input buffer circuit as claimed in claim 15, wherein the first and second transistors are formed of NMOSFETs.

23. An input buffer circuit as claimed in claim 15, wherein the first and second transistors are formed of PMOSFETs.

* * * * *

UNITED STATES PATENT AND TRADEMARK OFFICE
CERTIFICATE OF CORRECTION

PATENT NO. : 5,418,475
DATED : May 23, 1995
INVENTOR(S) : Shoji OTAKA

It is certified that error appears in the above-indentified patent and that said Letters Patent is hereby corrected as shown below:

Claim 1, Column 8, Lines 37,38,43,44, "termianl" should read --terminal--.

Claim 1, Column 8, Line 40, "transistir" should read --transistor--.

Claim 4, Column 8, Line 64, "comprise" should read --comprises--.

Claim 17, Column 10, Line 22, "comprise" should read --comprises--.

Claim 20, Column 10, Line 50, after "connected", insert --to--.

Signed and Sealed this

Twenty-fourth Day of October, 1995

Attest:

BRUCE LEHMAN

*Attesting Officer*          *Commissioner of Patents and Trademarks*